(12) United States Patent
Tamura

(10) Patent No.: US 11,450,538 B2
(45) Date of Patent: Sep. 20, 2022

(54) SUBSTRATE STAGE, SUBSTRATE PROCESSING APPARATUS, AND TEMPERATURE CONTROL METHOD

(71) Applicant: Tokyo Electron Limited, Tokyo (JP)

(72) Inventor: Hajime Tamura, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 258 days.

(21) Appl. No.: 16/922,172

(22) Filed: Jul. 7, 2020

(65) Prior Publication Data

US 2021/0013063 A1 Jan. 14, 2021

(30) Foreign Application Priority Data

Jul. 10, 2019 (JP) .............................. JP2019-128029

(51) Int. Cl.
*H01L 21/67* (2006.01)
*H01L 21/687* (2006.01)
*H01L 21/683* (2006.01)

(52) U.S. Cl.
CPC .. *H01L 21/67109* (2013.01); *H01L 21/68785* (2013.01); *H01L 21/6831* (2013.01); *H01L 21/6833* (2013.01); *H01L 21/6875* (2013.01)

(58) Field of Classification Search
CPC ........... H01L 21/67109; H01L 21/6833; H01L 21/6875; H01L 21/68785; H01L 21/6831
See application file for complete search history.

(56) References Cited

U.S. PATENT DOCUMENTS

| 7,854,821 B2 * | 12/2010 | Nakamura | ........ H01L 21/67109 |
| | | | 118/724 |
| 8,696,862 B2 * | 4/2014 | Sasaki | ................. H01L 21/6831 |
| | | | 118/724 |

FOREIGN PATENT DOCUMENTS

| JP | 2012-129547 A | | 7/2012 | |
| TW | 503452 B | * | 9/2002 | ......... H01L 21/6831 |

* cited by examiner

*Primary Examiner* — Ermias T Woldegeorgis
(74) *Attorney, Agent, or Firm* — Nath, Goldberg & Meyer; Jerald L. Meyer; Tanya E. Harkins

(57) ABSTRACT

A substrate stage includes: a base portion having a mounting surface; an annular support configured to support a substrate; an annular partition wall configured to divide the mounting surface into an outer region and an inner region in a radial direction of the substrate; a plurality of protrusions provided on the mounting surface and configured to support the substrate with a gap left between an upper end surface of the partition wall and the substrate; an outer flow path in communication with the outer region, and configured to allow a heat transfer gas supplied to a space between the substrate and the mounting surface to flow therethrough; an inner flow path in communication with the inner region, and configured to allow the heat transfer gas to flow therethrough; and an annular diffusion portion configured to diffuse the heat transfer gas along a circumferential direction of the partition wall.

13 Claims, 9 Drawing Sheets (A-A)

(C-C)

SUBSTRATE STAGE, SUBSTRATE PROCESSING APPARATUS, AND TEMPERATURE CONTROL METHOD

CROSS-REFERENCE TO RELATED APPLICATION(S)

This application is based upon and claims the benefit of priority from Japanese Patent Application No. 2019-128029, filed on Jul. 10, 2019, the entire contents of which are incorporated herein by reference.

TECHNICAL FIELD

The present disclosure relates to a substrate stage, a substrate processing apparatus, and a temperature control method.

BACKGROUND

Patent Document 1 discloses a substrate stage, which is provided with a circular partition wall on a substrate mounting surface side and configured such that a heat transfer gas circulates below a substrate.

PRIOR ART DOCUMENT

Patent Document

Patent Document 1: Japanese laid-open publication No. 2012-129547

SUMMARY

An aspect of the present disclosures provides a substrate stage including: a base portion having a mounting surface on which a substrate is mounted; an annular support provided on the base portion and configured to support the substrate along an outer peripheral side of the substrate; an annular partition wall provided on the mounting surface and configured to divide the mounting surface into an outer region and an inner region in a radial direction of the substrate mounted on the mounting surface; a plurality of protrusions provided on the mounting surface in the outer region and the inner region and configured to support the substrate with a gap left between an upper end surface of the partition wall and the substrate; an outer flow path provided in the base portion and in communication with the outer region, and configured to allow a heat transfer gas supplied to a space between the substrate and the mounting surface to flow through the outer flow path; an inner flow path provided in the base portion and in communication with the inner region, and configured to allow the heat transfer gas to flow through the inner flow path; and an annular diffusion portion provided in the base portion and configured to diffuse the heat transfer gas along a circumferential direction of the partition wall.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
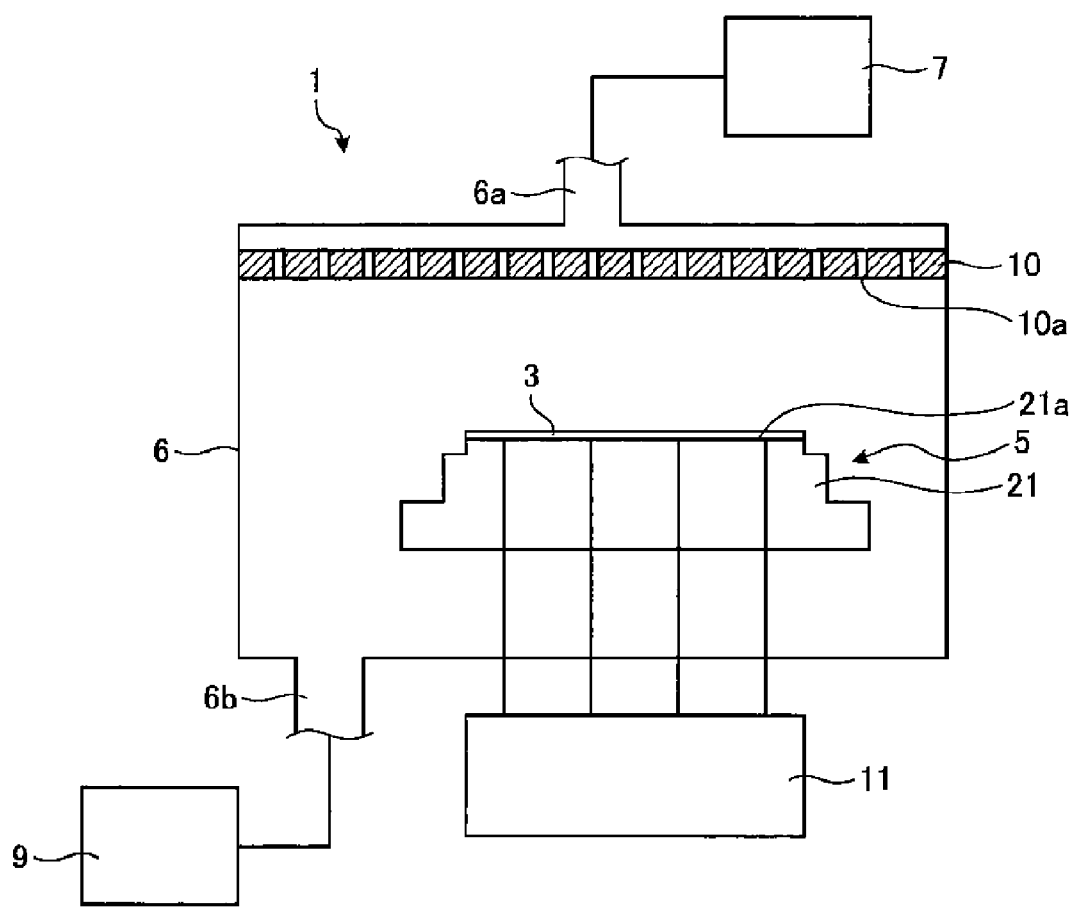
FIG. 1 is a schematic diagram showing the entirety of a substrate processing apparatus according to a first embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In the subject specification and the drawings, substantially the same components are denoted by like reference numerals, and duplicate descriptions thereof will be omitted. In the following descriptions, when a wafer as a substrate is mounted on a substrate stage of a substrate processing apparatus, the stage side as viewed from the wafer will be referred to as a lower side and the opposite side will be referred to as an upper side.

First Embodiment

FIG. 1 is a schematic diagram showing the entirety of a substrate processing apparatus according to a first embodiment. As shown in FIG. 1, a substrate processing apparatus 1 includes a substrate stage 5 on which a substrate 3 is mounted, a processing chamber 6 in which the substrate stage 5 is provided, a processing gas supplier 7 configured to supply a processing gas for processing the substrate 3, a heat transfer gas supplier 8 configured to supply a heat transfer gas to a closed space (heat transfer gas space) between the substrate 3 and the substrate stage 5, and a processing gas discharger 9 configured to discharge the processing gas from the interior of the processing chamber 6.

A gas supply pipe 6a connected to the processing gas supplier 7 is provided in an upper portion of the processing chamber 6, and a shower plate 10 having a plurality of gas supply holes 10a is provided at a position facing the gas supply pipe 6a. A gas discharge pipe 6b connected to the processing gas discharger 9 is provided in a lower portion of the processing chamber 6. As the processing gas, for example, a fluorine-containing gas or an oxygen-containing gas may be used. A compound containing hydrogen, nitrogen, chlorine, or the like may be added to the processing gas.

Figure 2:
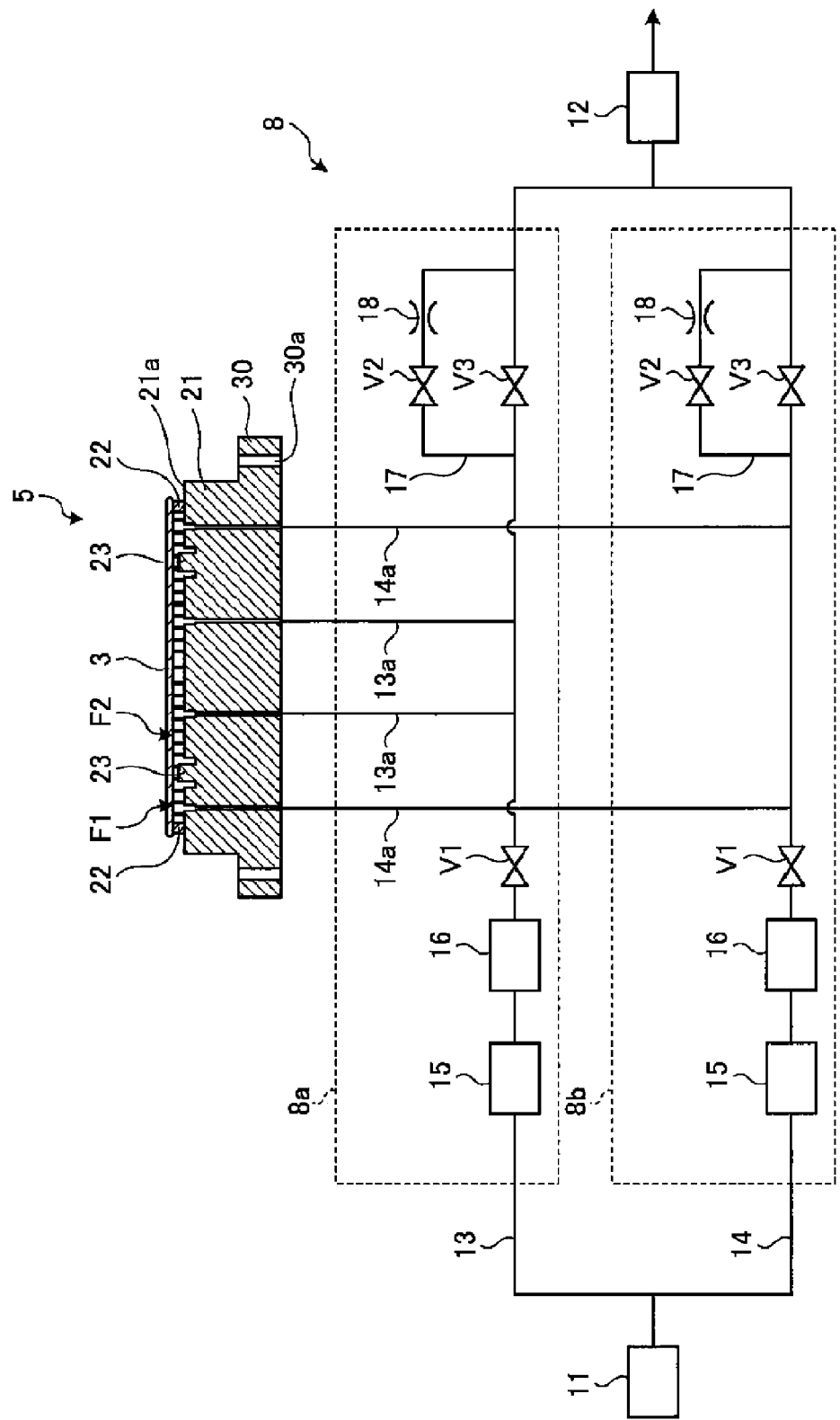
FIG. 2 is a schematic diagram for explaining a flow of a heat transfer gas in the substrate processing apparatus according to the first embodiment.

FIG. 2 is a schematic diagram for explaining a flow of the heat transfer gas in the substrate processing apparatus 1 according to the first embodiment. As shown in FIG. 2, the substrate stage 5 of the substrate processing apparatus 1 is connected to the heat transfer gas supplier 8. The heat transfer gas supplier 8 includes a heat transfer gas source 11, a vacuum pump 12, and first and second pipes 13 and 14 configured to connect the heat transfer gas source 11 and the vacuum pump 12 in parallel. An inner heat transfer gas supplier 8a configured to supply the heat transfer gas to an inner region F2 of a mounting surface 21a of the substrate stage 5 is provided on the side of the first pipe 13. An outer heat transfer gas supplier 8b configured to supply the heat transfer gas to an outer region F1 of the mounting surface 21a of the substrate stage 5 is provided on the side of the second pipe 14.

In each of the first pipe 13 and the second pipe 14, a gas pressure controller 15, a gas flow rate controller 16, and a supply valve V1 are provided in this order from the side of the heat transfer gas source 11. In each of the first pipe 13 and the second pipe 14, an exhaust valve V3 is provided on the side of the vacuum pump 12, and an exhaust valve V2 and an orifice 18 are provided in parallel with the exhaust valve V3 via a bypass pipe 17. The first pipe 13 is connected to the inner region F2 of the mounting surface 21a in the radial direction of the substrate 3 mounted on the substrate stage 5, which will be described later, via connection pipes 13a. The second pipe 14 is connected to the outer region F1 of the mounting surface 21a in the radial direction of the substrate 3 mounted on the mounting surface 21a of the substrate stage 5 via connection pipes 14a. The heat transfer gas is used to control a temperature of the substrates 3 placed on five substrate stage 5. For example, a helium gas or an argon gas is used as the heat transfer gas.

When correcting a temperature distribution unintentionally generated in the outer region F1 and the inner region F2 of the mounting surface 21a of the substrate stage 5, or when generating a temperature distribution in the outer region F1 and the inner region F2, for example, the heat transfer gas supplier 8 configured as described above makes a pressure in the inner region F2 higher than a pressure in the outer region F1. Thus, since the inner region F2 of the mounting surface 21a is relatively largely deprived of heat by the high-pressure heat transfer gas, the inner region F2 is more cooled than the outer region F1. When cooling the inner reaction gas F2 of the mounting surface 21a more than the outer region F1, the pressure of the heat transfer gas supplied from the heat transfer gas source 11 to the inner region F2 via the first pipe 13 and the connection pipes 13a is set to a high pressure, for example, about 50 Torr, and the pressure of the heat transfer gas supplied from the heat transfer gas source 11 to the outer region F1 via the second pipe 14 and the connection pipes 14a is set to a low pressure, for example, about 40 Torr. Due to the pressure difference between the outer region F1 and the inner region F2, the heat transfer gas flows from the high-pressure inner region F2 toward the low-pressure outer region F1 via a gap G between a below-described conductance band 23 and the substrate 3. The heat transfer gas flowing to the low-pressure outer region F1 passes through the second pipe 14 via the connection pipes 14a, and is discharged by the vacuum pump 12 via the exhaust valve V2 and the orifice 18 in the second pipe 14. At this time, in the second pipe 14, the exhaust valve V2 is opened and the exhaust valve V3 is closed. When the inner region F2 of the mounting surface 21a is set to a high pressure and the outer region F1 is set to a low pressure as described above, the exhaust valves V2 and V3 in the first pipe 13 are closed, and the heat transfer gas is not discharged via the valves V2 and V3 in the first pipe 13.

On the other hand, when cooling the outer region F1 of the mounting surface 21a of the substrate stage 5 more than the inner region F2, the high pressure side and the low pressure side are reversed as compared with the above-described case. In this case, the pressure of the heat transfer gas supplied from the heat transfer gas source 11 to the inner region F2 via the first pipe 13 and the connection pipes 13a is set to a low pressure, for example, about 40 Torr, and the pressure of the heat transfer gas supplied from the heat transfer gas source 11 to the outer region F1 via the second pipe 14 and the connection pipes 14a is set to a high pressure, for example, about 50 Torr. Due to the pressure difference between the outer region F1 and the inner region F2, the heat transfer gas flows from the high-pressure outer region F1 toward the low-pressure inner region F2 via the gap G between the below-described conductance band 23 and the substrate 3. The heat transfer gas from the low-pressure inner region F2 passes through the first pipe 13 via the connection pipes 13a, and is discharged by the vacuum pump 12 via the valve V2 and the orifice 18 in the first pipe 13. At this time, in the first pipe 13, the exhaust valve V2 is opened and the exhaust valve V3 is closed. When the outer region F1 of the mounting surface 21a is set to a high pressure and the inner region F2 is set to a low pressure as described above, the exhaust valves V2 and V3 in the second pipe 14 are closed, and the heat transfer gas is not discharged via the valves V2 and V3 in the second pipe 14.

By the way, when a fluid flows from a high-pressure place to a low-pressure place, a pressure difference inversely proportional to a conductance of a fluid path is generated at every point in the fluid path. In a case where portions of the fluid path differing in conductance are connected in series, a total pressure difference is distributed at a ratio of reciprocals of the conductances of the respective portions of the fluid path. While applying this principle to the mounting surface 21a of the substrate stage 5 in the present embodiment, a fluid flow path in which the heat transfer gas supplied from an outer flow path 26 to the outer region F1 reaches an inner flow path 27 of the inner region F2 is considered. In this case, the fluid path is considered as a series connection of 1) a path extending from a hole of the outer flow path 26 in the outer region F1 to the conductance band 23, 2) a path passing through the gap G between the conductance band 23 and the substrate 3, and 3) a path extending from the conductance band 23 to a hole of the inner flow path 27 in the inner region F2. The conductances of the respective portions are calculated as 1) $6 \times 10^{-6}$ m$^3$/sec, 2) $1 \times 10^{-6}$ m$^3$/sec, and 3) $1 \times 10^{-4}$ m$^3$/sec. The total pressure difference is 50 Torr–40 Torr=10 Torr. Since the pressure difference is distributed at the ratio of the reciprocals of the conductances, a pressure difference of 8.5 Torr corresponding to 85% of the total pressure difference is generated in the outer periphery and the inner periphery of the conductance band 23 of the present embodiment. At this time, a flow rate of the heat transfer gas generated by the total pressure difference of 10 Torr is 0.67 cc per minute under the standard atmospheric pressure.

For example, by setting the pressure of the heat transfer gas in the inner region F2 separated by the conductance band 23 to be higher than that in the outer region F1, it possible to cool a central portion of the substrate 3 more than an outer peripheral portion of the substrate 3 by the heat transfer gas. In the present embodiment, as an example, the pressure of the heat transfer gas in the inner region F2 is set to be 10 Torr higher than that in the outer region F1. However, the pressure difference, the pressure range, and the like are not limited, and may be changed by setting the heat transfer gas supplier 8. A distribution of cooling efficiency in the substrate 3 can be controlled by using the conductance band 23 as a boundary. Thus, it is possible to control process characteristics dependent on the temperature of the substrate 3, for example, a distribution of an etching rate on the surface of the substrate 3.

(Structure of Substrate Stage)

Figure 3:
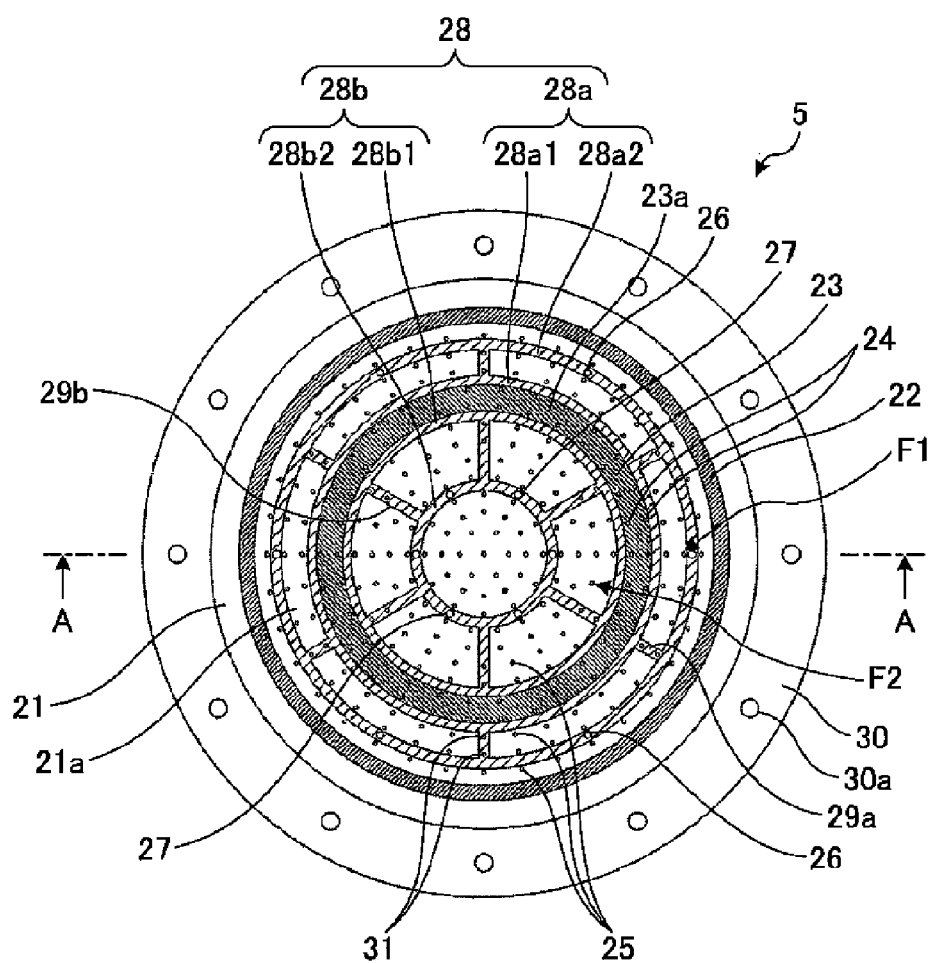
FIG. 3 is a plan view showing a substrate stage according to the first embodiment.
Figure 4:
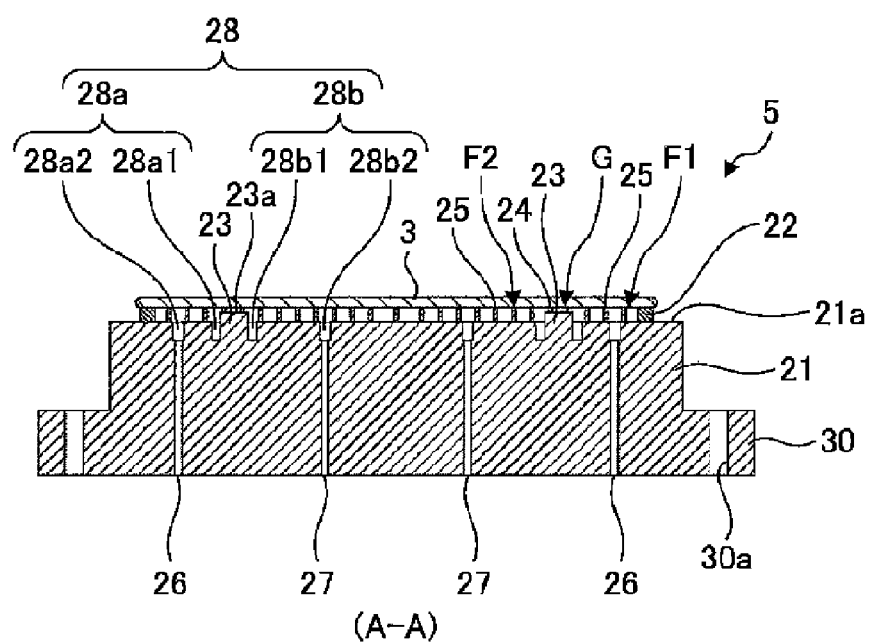
FIG. 4 is a vertical sectional view showing the substrate stage according to the first embodiment.

FIG. 3 is a plan view showing the substrate stage 5 according to the first embodiment. FIG. 4 is a vertical sectional view showing the substrate stage 5 according to the first embodiment, and illustrates a vertical sectional view taken along line A-A in FIG. 3. As shown in FIGS. 3 and 4, the substrate stage 5 includes a base portion 21 having the mounting surface 21a on which the substrate 3 is mounted, a seal band 22 as an annular support member configured to support the substrate 3 along an outer periphery of the substrate 3, and the conductance band 23 as an annular partition configured to divide the mounting surface 21a into the outer region F1 and the inner region F2 in the radial direction of the substrate 3 mounted on the mounting surface 21a (hereinafter, also simply referred to as the radial direction of the substrate 3). The substrate stage 5 further includes a plurality of first protrusions 24 and a plurality of second protrusions 25 configured to support the substrate 3 with the gap G left between an upper end surface 23a of the conductance band 23 and the substrate 3.

The mounting surface 21a of the base portion 21 is a surface facing the substrate 3, and is a surface on which the substrate 3 is mounted via the seal band 22, the first protrusions 24 on the conductance band 23, and the second protrusions 25 on the mounting surface 21a. The seal band 22 is provided on the mounting surface 21a of the base portion 21, and is formed to have a height of 15 µm from the mounting surface 21a. The conductance band 23 is provided on the mounting surface 21a of the base portion 21, and is arranged concentrically with the seal band 22.

The conductance band 23 is formed to have a height of 12 µm from the mounting surface 21a. The gap G of 3 µm is secured between the substrate 3 supported by the seal band 22 and the upper end surface 23a of the conductance band 23. Furthermore, the conductance band 23 is formed to have a width of 10 mm in the radial direction of the substrate 3, i.e., in the radial direction of the conductance band 23. The conductance band 23 is a structural portion that becomes a resistance against a flow of the heat transfer gas between the outer region F1 and the inner region F2 of the mounting surface 21a of the base portion 21.

The first protrusions 24 are formed in a columnar shape and are provided on the upper end surface 23a of the conductance band 23. The first protrusions 24 are formed to have a height of 3 µm from the upper end surface 23a of the conductance band 23. The first protrusions 24 are arranged at predetermined intervals along the circumferential direction of the conductance band 23, and are arranged in two rows concentrically with respect to the center of the substrate 3. The first protrusions 24 may be arranged in a staggered pattern with positions of the first protrusions 24 in the rows alternately shifted with respect to the circumferential direction of the conductance band 23.

The second protrusions 25 are formed in a columnar shape and are provided on the mounting surface 21a in the outer region F1 and the inner region F2. The second protrusions 25 are formed to have a height of 15 µm from the mounting surface 21a, which is equal to the height of the seal band 22. As shown in FIG. 3, the second protrusions 25 are arranged radially from the center of the mounting surface 21a.

The substrate 3 mounted on the mounting surface 21a is supported by the seal band 22, the first protrusions 24, and the second protrusions 25. At this time, the gap G of 3 µm is secured between the upper end surface 23a of the conductance band 23 and the substrate 3 in a vertical direction of the base portion 21, i.e., in a thickness direction of the substrate 3. Since the upper end surface 23a of the conductance band 23 and the substrate 3 is not in contact with each other by securing the gap G as described above, it is possible to suppress heat transfer between the substrate 3 and the conductance band 23. Therefore, it is possible to prevent generation of a temperature singular point, which has a locally reduced temperature, in a portion of the substrate 3 directly above the conductance band 23.

Furthermore, the substrate stage 5 includes the outer flow path 26 through which the heat transfer gas supplied to the closed space between the substrate 3 and the mounting surface 21a flows, the inner flow path 27 through which the heat transfer gas flows, and an electrostatic chuck (not shown) configured to hold the substrate 3 mounted on the mounting surface 21a. Furthermore, the substrate stage 5 includes a coolant flow path (not shown) for circulating a coolant inside the substrate stage 5. The coolant flow path is connected to an external chiller (not shown) via a hose for supplying the coolant. Heat from plasma generated in the processing chamber 6 during the processing of the substrate 3 is introduced into the substrate 3 and the substrate stage 5. By circulating the coolant inside the substrate stage 5, the heat introduced from the plasma is removed, and the temperature of the substrate 3 under processing and the temperature of the substrate stage 5 are controlled to a predetermined temperature.

The outer flow path 26 is provided in the base portion 21 and in communication with the outer region F1. The outer flow path 26 penetrates the base portion 21 along the vertical direction of the base portion 21. A plurality of outer flow paths 26 is arranged at predetermined intervals in the circumferential direction of the conductance band 23. For example, six outer flow paths 26 are provided at rotational angle intervals of 60 degrees about the center of the mounting surface 21a. The outer flow paths 26 are connected to the connection pipes 14a of the heat transfer gas supplier 8 (see FIG. 2).

The inner flow path 27 is provided in the base portion 21 and in communication with the inner region F2. The inner flow path 27 penetrates the base portion 21 along the vertical direction of the base portion 21. A plurality of inner flow paths 27 is arranged at predetermined intervals in the circumferential direction of the conductance band 23. For example, six inner flow paths 27 are provided at rotation angle intervals of 60 degrees about the center of the mounting surface 21a. As shown in FIG. 3, the inner flow paths 27 have the same positions as the outer flow paths 26 in the circumferential direction of the conductance band 23. The inner flow paths 27 are connected to the connection pipes 13a of the heat transfer gas supplier 8 (see FIG. 2).

Although not shown, the electrostatic chuck includes an insulator and an electrode, and is disposed on the base portion 21. The electrostatic chuck holds the substrate 3 mounted on the mounting surface 21a as a voltage is applied to the electrode. A chuck for holding the substrate 3 on the substrate stage 5 is not limited to the electrostatic chuck, and a chuck for mechanically holding the substrate 3 may be used.

(Structure of Diffusion Portion)

As shown in FIGS. 3 and 4, the substrate stage 5 includes an annular diffusion portion 28 configured to diffuse the heat transfer gas along the circumferential direction of the conductance band 23. The diffusion portion 28 is provided as a recess opened on the mounting surface 21a of the base portion 21, and is formed to have a rectangular groove-shaped cross section. The diffusion portion 28 includes an outer diffusion portion 28a in communication with the outer region F1 and an inner diffusion portion 28b in communication with the inner region F2.

The outer diffusion portion 28a causes the heat transfer gas flowing from the outer flow path 26 into the outer region F1 to be diffused along the circumferential direction on the outer peripheral side of the conductance band 23. The inner diffusion portion 28b causes the heat transfer gas flowing from the inner flow path 27 into the inner region F2 to be diffused along the circumferential direction on the inner peripheral side of the conductance band 23.

Figure 5:
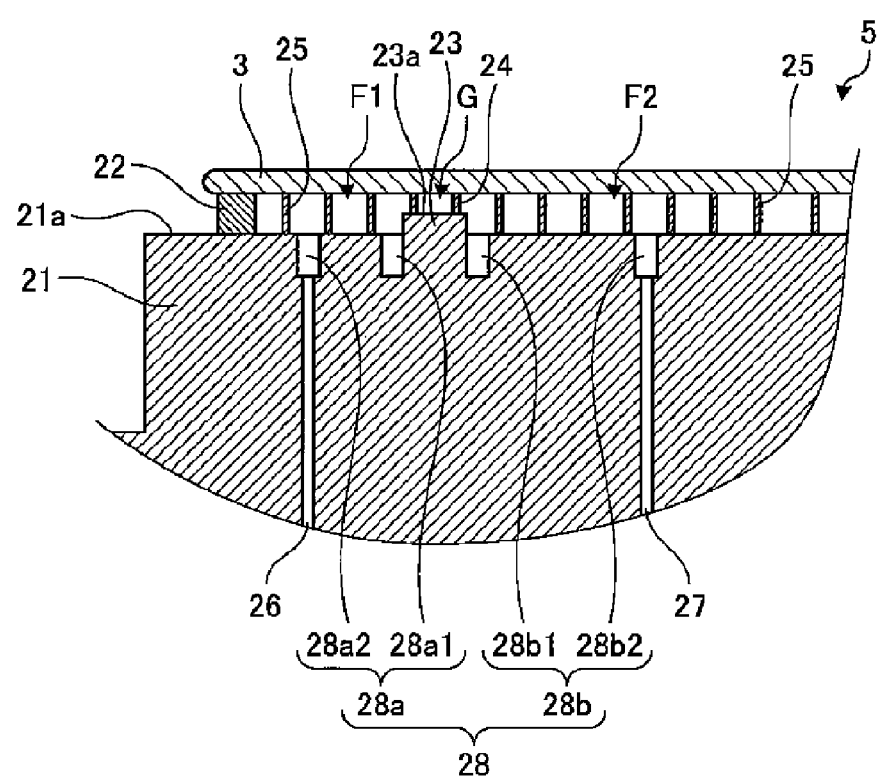
FIG. 5 is an enlarged vertical sectional view showing a main portion of the substrate stage according to the first embodiment.

FIG. 5 is an enlarged vertical sectional view showing a main part of the substrate stage 5 according to the first embodiment. As shown in FIGS. 4 and 5, the outer diffusion portion 28a includes a first outer diffusion portion 28a1 opened on the mounting surface 21a and provided along the outer circumferential surface of the conductance band 23, and a second outer diffusion portion 28a2 opened on the mounting surface 21a and provided at the end portion of the outer flow path 26. As shown in FIG. 3, the second outer diffusion portion 28a2 is disposed at a distance from the inner circumferential surface of the seal band 22 in the radial direction of the substrate 3.

As shown in FIGS. 4 and 5, the inner diffusion portion 28b includes a first inner diffusion portion 28b1 opened on the mounting surface 21a and provided along the inner circumferential surface of the conductance band 23, and a second inner diffusion portion 28b2 opened on the mounting surface 21a and provided at the end portion of the inner flow path 27. As shown in FIG. 3, the second inner diffusion portion 28b2 is disposed substantially in the middle between the center of the mounting surface 21a and the inner circumferential surface of the conductance band 23 in the radial direction of the substrate 3.

In the base portion 21, connection paths 29a configured to bring the first outer diffusion portion 28a1 and the second outer diffusion portion 28a2 into communication with each other are provided to extend along the radial direction of the substrate 3 mounted on the mounting surface 21a. The connection paths 29a are provided as recesses opened on the mounting surface 21a. The heat transfer gas flowing along the first outer diffusion portion 28a1 and the second outer diffusion portion 28a2 flows between the first outer diffusion portion 28a1 and the second outer diffusion portion 28a2 via the connection paths 29a. The first outer diffusion portion 28a1, the second outer diffusion portion 28a2, and the connection paths 29a are arranged so as to surround the outer region F1. As a result, the conductance of the entire outer region F1 is improved, and the pressure in the outer region F1 is made uniform.

In addition, in the base portion 21, connection paths 29b configured to bring the first inner diffusion portion 28b1 and the second inner diffusion portion 28b2 into communication with each other are provided to extend along the radial direction of the substrate 3 mounted on the mounting surface 21a. The connection paths 29b are provided as recesses opened on the mounting surface 21a and are formed to have a rectangular groove-shaped cross section. The heat transfer gas flowing along the first inner diffusion portion 28b1 and the second inner diffusion portion 28b2 flows between the first inner diffusion portion 28b1 and the second inner diffusion portion 28b2 via the connection paths 29b. The first inner diffusion portion 28b1, the second inner diffusion portion 28b2, and the connection paths 29b are arranged so as to surround the inner region F2. As a result, the conductance of the entire inner region F2 is improved, and the pressure in the inner region F2 is made uniform.

In addition, as shown in FIG. 3, a plurality of third protrusions 31 configured to support the substrate 3 is provided on bottom surfaces of the connection paths 29a and 29b. The third protrusions 31 are formed to have a height of 65 μm from the bottom surfaces of the connection paths 29a and 29b, and positions of distal ends of the third protrusions 31 are flush with the upper end surface of the seal band 22 and distal ends of the first protrusions 24 and the second protrusions 25. The substrate stage 5 is not limited to the structure having the third protrusion 31.

The cross-sectional shape of the diffusion portion 28 is not limited to the rectangular groove shape, and may be, for example, a V-groove shape or a cross-sectional shape that has a tapered surface having a width in the radial direction of the substrate 3 gradually increasing toward the mounting surface 21a. Furthermore, although the connection paths 29a and 29b are formed so as to be opened on the mounting surface 21a, the connection paths 29a and 29b may be provided as internal spaces of the base portion 21.

As shown in FIGS. 3 and 4, a flange-shaped fixing portion 30 is formed on the outer peripheral portion of the base portion 21. A plurality of fixing holes 30a through which fixing members (not shown) such as bolts or the like pass is provided at intervals in the circumferential direction of the fixing portion 30.

(Diffusion Action by Diffusion Portion)

As described above, the conductance in the outer region F1 is improved by the first outer diffusion portion 28a1, the second outer diffusion portion 28a2, and the connection paths 29a. Therefore, pressure gradient of the heat transfer gas in the outer region F1 is suppressed, and the pressure of the heat transfer gas in the outer region F1 is made uniform. Similarly, the conductance in the inner region F2 is improved by the first inner diffusion portion 28b1, the second inner diffusion portion 28b2, and the connection paths 29b. Therefore, pressure gradient of the heat transfer gas in the inner region F2 is suppressed, and the pressure of the heat transfer gas in the inner region F2 is made uniform.

Furthermore, the height of the upper end surface 23a of the conductance band 23 may vary in the circumferential direction of the conductance band 23 due to a manufacturing error of the substrate stage 5, over-time abrasion of the substrate stage 5, and the like. In this case, the heat transfer gas easily intrudes from a position where the gap G between the substrate 3 and the upper end surface 23a of the conductance band 23 is relatively large (a position where the height of the conductance band 23 is low) in the circumferential direction of the conductance band 23. Therefore, pressure gradient of the heat transfer gas may occur in the circumferential direction of the conductance band 23 even in portions other than the conductance band 23 (in the outer region F1 and the inner region F2). Accordingly, when pressure gradient is generated toward the position where the heat transfer gas easily intrudes in the circumferential direction of the conductance band 23, the pressure distribution becomes axially asymmetric with respect to a central axis of the substrate 3. Thus, an axially asymmetric distribution is also generated in etching characteristics.

Even in this case, the heat transfer gas locally intruding from a portion in the circumferential direction of the conductance band 23 passes through the first outer diffusion portion 28a1 extending along the outer circumferential surface of the conductance band 23 and the first inner diffusion portion 28b1 extending along the inner circumferential surface of the conductance band 23, and flows along the circumferential direction of the conductance band 23. Therefore, even when a flow rate concentration occurs on the conductance band 23, pressure gradient of the heat transfer gas in the circumferential direction of the conductance band 23 is restrained from occurring in portions other than the conductance band 23. Also in this case, the heat transfer gas locally intruding from a portion in the circumferential direction of the conductance band 23 passes through the second outer diffusion portion 28a2 and the second inner diffusion portion 28b2, and flows along the circumferential direction of the conductance band 23. Therefore, pressure gradient of the heat transfer gas in the circumferential direction of the conductance band 23 is further suppressed.

(Temperature Control Method)

A temperature control method according to an embodiment includes: supporting the substrate 3 along the outer peripheral side of the substrate 3 by the annular seal band 22, which is provided on the base portion 21 having the mounting surface 21a on which the substrate 3 is mounted; and supporting the substrate 3 by the first protrusions 24 provided on the conductance band 23 with the gap G left between the upper end surface 23a of the conductance band 23 and the substrate 3, while dividing the mounting surface 21a into the outer region F1 and the inner region F2 in the radial direction of the substrate 3 mounted on the mounting surface 21a by the annular conductance band 23 provided on the mounting surface 21a. The temperature control method further includes: diffusing the heat transfer gas supplied to the space between the substrate 3 and the mounting surface 21a via the outer flow path 26 and the inner flow path 27, which are provided in the base portion 21 and in communication with the outer region F1 and the inner region F2, respectively, along the circumferential direction of the conductance band 23 by the annular diffusion portion 28 provided in the base portion 21.

Effects of First Embodiment

The substrate stage 5 according to the first embodiment includes the seal band 22 configured to support the substrate 3, the conductance band 23 configured to divide the mounting surface 21a into the outer region F1 and the inner region F2, the plurality of second protrusions 25 configured to support the substrate 3 with the gap G left between the conductance band 23 and the substrate 3, the outer flow path 26 and the inner flow path 27 through which the heat transfer gas flows, and the annular diffusion portion 28 configured to diffuse the heat transfer gas along the circumferential direction of the conductance band 23. Since the heat transfer gas is smoothly diffused in the circumferential direction of the conductance band 23 by the diffusion portion 28, the conductance of the outer region F1 and the conductance of the inner region F2 are improved and make relatively large conductance ratios with respect to the conductance band 23. Therefore, it is possible to secure a large pressure difference between the outer region F1 and the inner region F2 divided by the conductance band 23. As a result, the temperature distribution (pressure distribution) of the substrate 3 having a temperature controlled by the heat transfer gas can be controlled so as to change sharply between the outer region F1 and the inner region F2. Accordingly, it is possible to increase accuracy of controlling the temperature of the substrate 3 using the heat transfer gas. In particular, when controlling the process characteristics of the substrate 3, it may be necessary to control the local temperature distribution of the substrate 3. Therefore, by making it possible to generate a steep pressure difference using the conductance band 23 as a boundary, it is possible to expand a range of controlling the process characteristics.

Furthermore, the diffusion portion 28 of the substrate stage 5 according to the first embodiment includes the outer diffusion portion 28a provided in communication with the outer region F1 and configured to diffuse the heat transfer gas along the circumferential direction on the outer peripheral side of the conductance band 23, and the inner diffusion portion 28b provided in communication with the inner region F2 and configured to diffuse the heat transfer gas along the circumferential direction on the inner peripheral side of the conductance band 23. When the heat transfer gas passing through the gap G between the conductance band 23 and the substrate 3 flows locally in a large flow rate from a portion of the conductance band 23 in the circumferential direction, even when one of the outer region F1 and the inner region F2 is the low pressure side, the heat transfer gas can be caused to flow along the circumferential direction of the conductance band 23 by either the outer diffusion portion 28a or the inner diffusion portion 28b. Therefore, it is possible to suppress the pressure gradient of the heat transfer gas from occurring in the outer region F1 and the inner region F2.

In addition, the outer diffusion portion 28a of the substrate stage 5 according to the first embodiment includes the first outer diffusion portion 28a1 opened on the mounting surface 21a and provided along the outer circumferential surface of the conductance band 23, and the second outer diffusion portion 28a2 opened on the mounting surface 21a and provided at the end portion of the outer flow path 26. Accordingly, the heat transfer gas in the outer region F1 can be smoothly diffused in the circumferential direction of the conductance band 23 by the first outer diffusion portion 28a1 and the second outer diffusion portion 28a2. Therefore, the pressure of the heat transfer gas in the outer region F1 can be made more uniform, and the accuracy of controlling the temperature distribution of the substrate 3 can be improved. Since the first outer diffusion portion 28a1 and the second outer diffusion portion 28a2 are opened on the mounting surface 21a, it is possible to ensure good machinability of the first outer diffusion portion 28a1 and the second outer diffusion portion 28a2.

Moreover, the inner diffusion portion 28b of the substrate stage 5 according to the first embodiment includes the first inner diffusion portion 28b1 opened on the mounting surface 21a and provided along the inner circumferential surface of the conductance band 23, and the second inner diffusion portion 28b2 opened on the mounting surface 21a and provided at the end portion of the inner flow path 27. Accordingly, the heat transfer gas in the inner region F2 can be smoothly diffused in the circumferential direction of the conductance band 23 by the first inner diffusion portion 28b1 and the second inner diffusion portion 28b2. Therefore, the pressure of the heat transfer gas in the inner region F2 can be made more uniform, and the accuracy of controlling the temperature distribution of the substrate 3 can be improved. Since the first inner diffusion portion 28b1 and the second inner diffusion portion 28b2 are opened on the mounting surface 21a, it is possible to ensure good machinability of the first inner diffusion portion 28b1 and the second inner diffusion portion 28b2.

Furthermore, the base portion 21 of the substrate stage 5 according to the first embodiment is provided with the connection paths 29a that bring the first outer diffusion portion 28a1 and the second outer diffusion portion 28a2 into communication with each other. Thus, in the outer region F1, the heat transfer gas flowing through the first outer diffusion portion 28a1 and the second outer diffusion portion 28a2 can flow between the first outer diffusion portion 28a1 and the second outer diffusion portion 28a2 via the connection paths 29a. Therefore, the pressure of the heat transfer gas in the outer region F1 can be made more uniform, and the accuracy of controlling the temperature distribution of the substrate 3 can be improved.

Moreover, the base portion 21 of the substrate stage 5 according to the first embodiment is provided with the connection paths 29b that bring the first inner diffusion portion 28b1 and the second inner diffusion portion 28a2 into communication with each other. Thus, in the inner region F2, the heat transfer gas flowing through the first inner diffusion portion 28b1 and the second inner diffusion portion 28b2 can flow between the first inner diffusion portion 28b1 and the second inner diffusion portion 28b2 via the connection paths 29b. Therefore, the pressure of the heat transfer gas in the inner region F2 can be made more uniform, and the accuracy of controlling the temperature distribution of the substrate 3 can be improved.

Furthermore, in the substrate stage 5 according to the first embodiment, the conductance band 23 is provided with the plurality of first protrusions 24 that supports the substrate 3 with the gap G left between the conductance band 23 and the substrate 3. By supporting the substrate 3 with the first protrusions 24 as described above, it is possible to enhance stability of the support state of the substrate 3 mounted on the mounting surface 21a.

The first embodiment is not limited to include both the outer diffusion portion 28a and the inner diffusion portion 28b. The diffusion portion 28 may be provided only in the outer region F1 or the inner region F2, whichever has a lower pressure (higher temperature). For example, in a case where the substrate stage 5 is used to perform a control to obtain a temperature distribution in which the inner region F2 has a low temperature and the outer region F1 has a high temperature, only the outer diffusion portion 28a may be provided. By omitting the inner diffusion portion 28b, it possible to simplify the structure of the substrate stage 5 and to reduce a manufacturing cost of the substrate stage 5.

Second Embodiment

Figure 6:
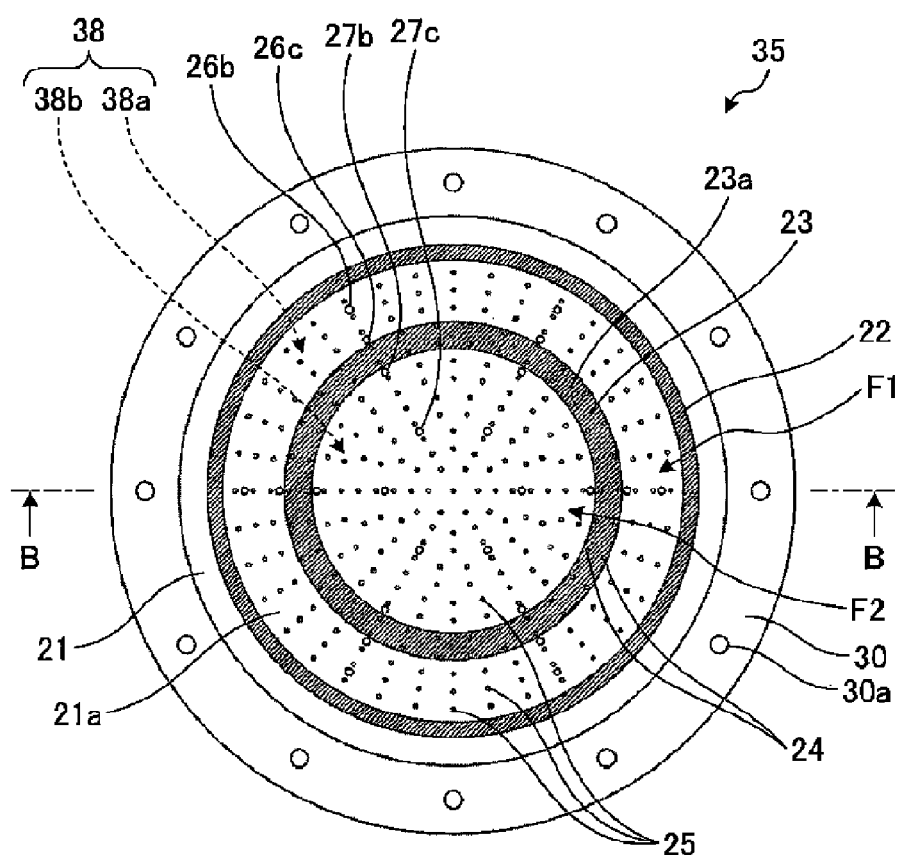
FIG. 6 is a plan view showing a substrate stage according to a second embodiment.
Figure 7:
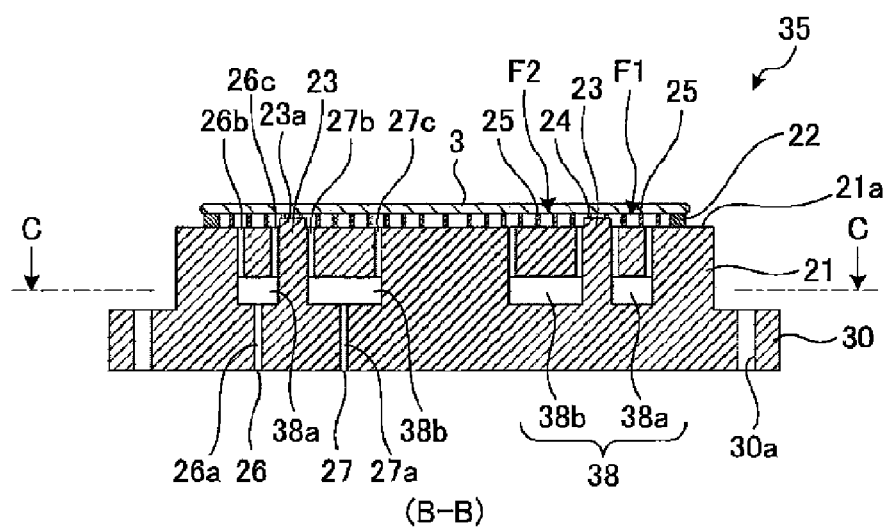
FIG. 7 is a vertical sectional view showing the substrate stage according to the second embodiment.

FIG. 6 is a plan view showing a substrate stage according to a second embodiment. FIG. 7 is a vertical sectional view showing the substrate stage according to the second embodiment and illustrates a vertical sectional view taken along line B-B in FIG. 6. The second embodiment differs from the first embodiment in that the diffusion portion is provided inside the base portion 21.

As shown in FIGS. 6 and 7, a substrate stage 35 includes an annular diffusion portion 38 configured to diffuse the heat transfer gas along the circumferential direction of the conductance band 23. The diffusion portion 38 is provided as an internal space of the base portion 21 and is formed to have a rectangular cross section. The diffusion portion 38 may be formed to have, for example, a circular cross section. The diffusion portion 38 includes an outer diffusion portion 38a in communication with the outer region F1 and an inner diffusion portion 38b in communication with the inner region F2.

(Structure of Diffusion Portion)

Figure 8:
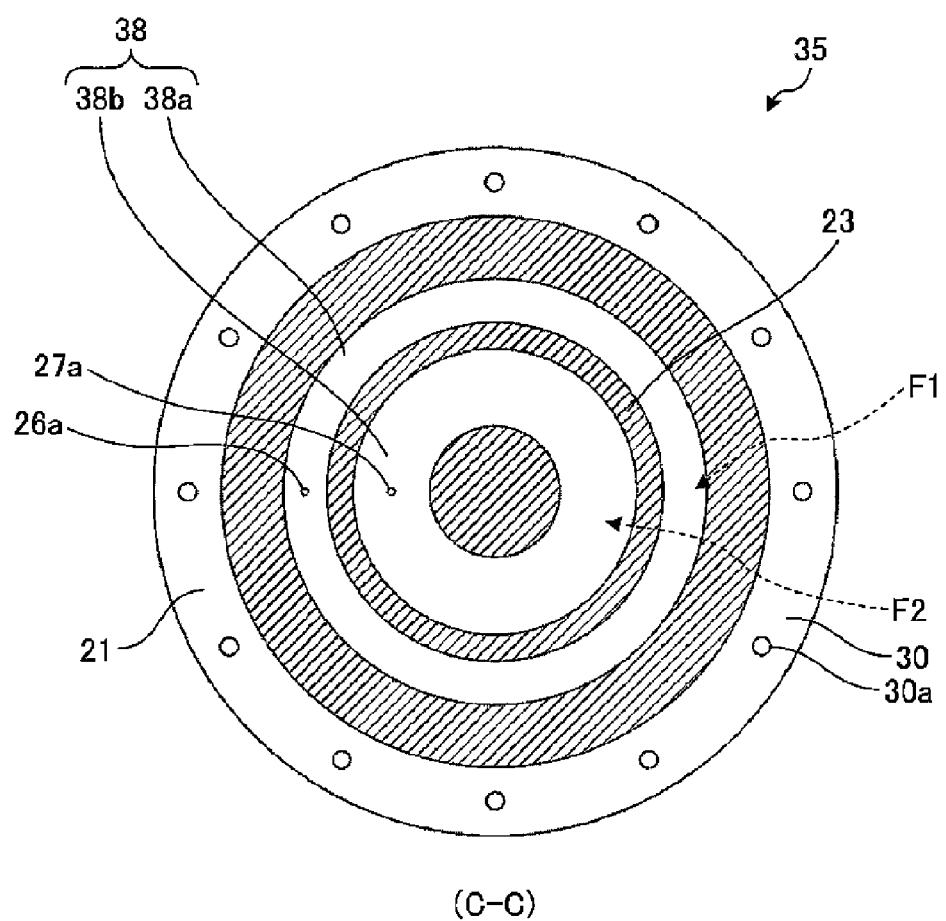
FIG. 8 is a horizontal sectional view showing a main part of the substrate stage according to the second embodiment.
Figure 9:
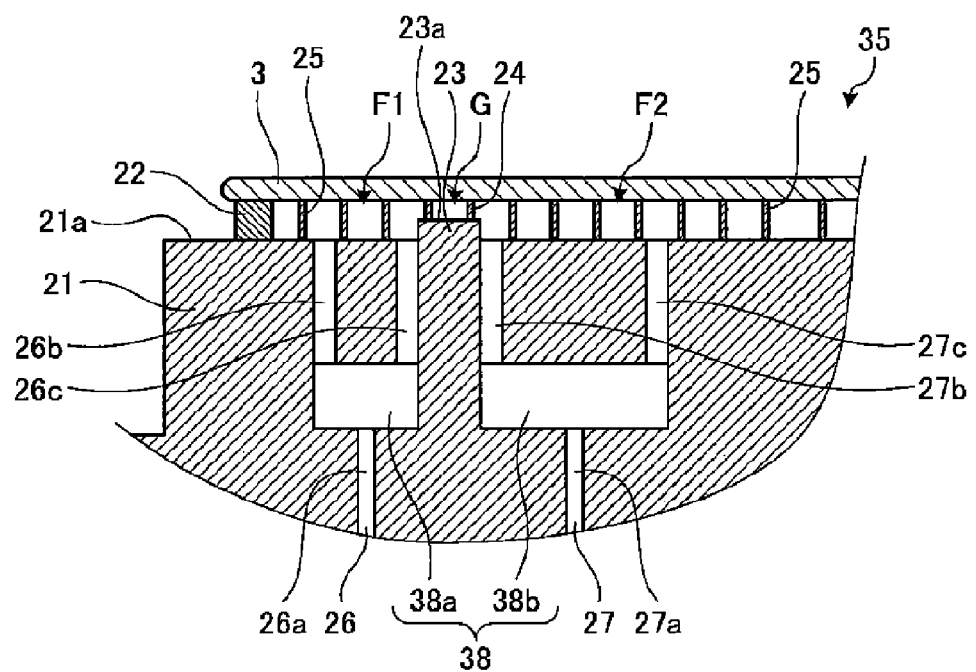
FIG. 9 is an enlarged sectional view showing a main part of the substrate stage according to the second embodiment.

FIG. 8 is a horizontal sectional view showing a main part of the substrate stage according to the second embodiment, and illustrates a sectional view taken along line C-C in FIG. 7. FIG. 9 is an enlarged sectional view showing the main part of the substrate stage according to the second embodiment. As shown in FIGS. 7 and 9, the outer diffusion portion 38a is provided inside the base portion 21 and in communication with the outer flow path 26. The inner diffusion portion 38b is provided inside the base portion 21 and in communication with the inner flow path 27.

As shown in FIGS. 7 and 8, the outer flow path 26 includes a main flow path 26a extending from the outer diffusion portion 38a to the bottom surface of the base portion 21. The main flow path 26a is connected to the connection pipe 14a of the heat transfer gas supplier 8 (see FIG. 2). The inner flow path 27 includes a main flow path 27a extending from the inner diffusion portion 38b to the bottom surface of the base portion 21. The main flow path 27a is connected to the connection pipe 13a of the heat transfer gas supplier 8 (see FIG. 2). One main flow path 26a of the outer flow path 26 is provided at a predetermined position in the circumferential direction of the conductance band 23. Similarly, one main flow path 27a of the inner flow path 27 is provided at a predetermined position in the circumferential direction of the conductance band 23.

The outer flow path 26 further includes an outer branch flow path 26b extending from the outer peripheral side of the outer diffusion portion 38a to the mounting surface 21a in the radial direction of the substrate 3 mounted on the mounting surface 21a, and an inner branch flow path 26c extending from the inner peripheral side of the outer diffusion portion 38a to the mounting surface 21a. The inner branch flow path 26c of the outer flow path 26 is provided adjacent to the outer circumferential surface of the conductance band 23, such that the heat transfer gas flowing into the outer region F1 from the side of the upper end surface 23a of the conductance band 23 is smoothly guided into the outer diffusion portion 38a via the inner branch flow path 26c. Therefore, the heat transfer gas flowing from the inner branch flow path 26c into the outer diffusion portion 38a smoothly flows along the circumferential direction of the conductance band 23 through the outer diffusion portion 38a.

The inner flow path 27 further includes an outer branch flow path 27b extending from the outer peripheral side of the inner diffusion portion 38b to the mounting surface 21a in the radial direction of the substrate 3 mounted on the mounting surface 21a, and an inner branch flow path 27c extending from the inner peripheral side of the inner diffusion portion 38b to the mounting surface 21a. The outer branch flow path 27b of the inner flow path 27 is provided adjacent to the inner circumferential surface of the conductance band 23, such that the heat transfer gas flowing into the inner region F2 from the side of the upper end surface 23a of the conductance band 23 is smoothly guided into the inner diffusion portion 38b through the outer branch flow path 27b. Therefore, the heat transfer gas flowing from the outer branch flow path 27b into the inner diffusion portion 38b smoothly flows along the circumferential direction of the conductance band 23 through the inner diffusion portion 38b.

(Diffusion Action by Diffusion Portion)

In the second embodiment as well, just like the diffusion portion 28 of the first embodiment, the outer diffusion portion 38a is formed along the circumferential direction of the conductance band 23. Therefore, the heat transfer gas supplied to the outer region F1 through the outer flow path 26 flows in the circumferential direction of the conductance band 23 through the outer diffusion portion 38a and smoothly spreads in the outer region F1 via the outer branch flow path 26b and the inner branch flow path 26c. Thus, the pressure gradient of the heat transfer gas in the outer region F1 is suppressed, and the pressure of the heat transfer gas in the outer region F1 is made uniform. Similarly, the inner diffusion portion 38b is formed along the circumferential direction of the conductance band 23. Therefore, the heat transfer gas supplied to the inner region F2 through the inner flow path 27 flows in the circumferential direction of the conductance band 23 through the inner diffusion portion 38b and smoothly spreads in the inner region F2 via the outer branch flow path 27b and the inner branch flow path 27c. Thus, the pressure gradient of the heat transfer gas in the inner region F2 is suppressed, and the pressure of the heat transfer gas in the inner region F2 is made uniform.

Furthermore, even when the height of the conductance band 23 varies in the circumferential direction of the conductance band 23, the heat transfer gas locally intruding from a portion of the conductance band 23 in the circumferential direction flows along the circumferential direction of the conductance band 23 through the outer diffusion portion 38a in communication with the outer region F1 and the inner diffusion portion 38b in communication with the inner region F2. Therefore, the pressure gradient of the heat transfer gas in the circumferential direction of the conductance band 23 is suppressed, and the pressures of the heat transfer gas in the outer region F1 and the inner region F2 are made uniform.

Effects of Second Embodiment

The substrate stage 35 according to the second embodiment is provided with the diffusion portion 38. Therefore, as in the first embodiment, it is possible to secure a large pressure difference between the outer region F1 and the inner region F2 divided by the conductance band 23. Thus, it is possible to control the temperature distribution of the substrate 3 so as to be changed sharply between the outer region F1 and the inner region F2. Therefore, it is possible to enhance the accuracy of controlling the temperature of the substrate 3 using the heat transfer gas.

In addition, the diffusion portion 38 of the substrate stage 35 is provided inside the base portion 21 without being opened on the mounting surface 21a. Therefore, it is possible to suppress influence of the diffusion portion 38 on the process characteristics when the substrate 3 is processed with the processing gas. Presence of recess opened on the mounting surface 21a may affect the process characteristics when processing the substrate 3, depending on a width and depth of the recess. However, the second embodiment is advantageous in that the pressure gradient in the outer region F1 and the inner region F2 can be suppressed without affecting the mounting surface 21a.

Furthermore, the substrate stage 35 can secure a large space that functions as the diffusion portion 38, as compared with the diffusion portion 28 according to the first embodiment. Thus, fluidity of the heat transfer gas in the circumferential direction of the conductance band 23 is increased. Therefore, for example, even when the heat transfer gas locally flows between the outer region F1 and the inner region F2 from a portion of the conductance band 23 in the circumferential direction due to a manufacturing variation of the conductance band 23, the pressure gradient of the heat transfer gas in the circumferential direction of the conductance band 23 is suppressed, and the pressures of the heat transfer gas in the outer region F1 and the inner region F2 are made uniform.

The substrate stages 5 and 35 according to the first and second embodiments, respectively, includes one conductance band 23. However, the substrate stages 5 and 35 may include a plurality of conductance bands. In this case, the conductance bands are arranged concentrically with respect to the center of the mounting surface 21a. Furthermore, if necessary, the first embodiment and the second embodiment may be combined with each other. For example, the substrate stage may include the outer diffusion portion 38a and the inner diffusion portion 38b according to the second embodiment, and the second outer diffusion portion 28a2 and the second inner diffusion portion 28b2 according to the first embodiment.

According to the present disclosure in some embodiments, it is possible to control a temperature distribution of a substrate so as to be sharply changed inside and outside a partition wall.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate stage, comprising:
   a base portion having a mounting surface on which a substrate is mounted;
   an annular support provided on the base portion and configured to support the substrate along an outer peripheral side of the substrate;
   an annular partition wall provided on the mounting surface and configured to divide the mounting surface into an outer region and an inner region in a radial direction of the substrate mounted on the mounting surface;
   a plurality of protrusions provided on the mounting surface in the outer region and the inner region and configured to support the substrate with a gap left between an upper end surface of the partition wall and the substrate;
   an outer flow path provided in the base portion and in communication with the outer region, and configured to allow a heat transfer gas supplied to a space between the substrate and the mounting surface to flow through the outer flow path;
   an inner flow path provided in the base portion and in communication with the inner region, and configured to allow the heat transfer gas to flow through the inner flow path; and
   an annular diffusion portion provided in the base portion and configured to diffuse the heat transfer gas along a circumferential direction of the partition wall.

2. The substrate stage of claim 1, wherein the annular diffusion portion includes an outer diffusion portion in communication with the outer region and configured to diffuse the heat transfer gas along the circumferential direction on an outer peripheral side of the partition wall, and an inner diffusion portion in communication with the inner region and configured to diffuse the heat transfer gas along the circumferential direction on an inner peripheral side of the partition wall.

3. The substrate stage of claim 2, wherein the outer diffusion portion includes a first outer diffusion portion opened on the mounting surface and provided along an outer circumferential surface of the partition wall, and a second outer diffusion portion opened on the mounting surface and provided at an end portion of the outer flow path.

4. The substrate stage of claim 3, wherein the base portion is provided with a connection path configured to bring the first outer diffusion portion and the second outer diffusion portion into communication with each other.

5. The substrate stage of claim 4, wherein the partition wall is provided with a plurality of protrusions configured to support the substrate with the gap left between the upper end surface of the partition wall and the substrate.

6. The substrate stage of claim 2, wherein the inner diffusion portion includes a first inner diffusion portion opened on the mounting surface and provided along an inner circumferential surface of the partition wall, and a second inner diffusion portion opened on the mounting surface and provided at an end portion of the inner flow path.

7. The substrate stage of claim 6, wherein the base portion is provided with a connection path configured to bring the first inner diffusion portion and the second inner diffusion portion into communication with each other.

8. The substrate stage of claim 1, wherein the annular diffusion portion is provided inside the base portion and in communication with one of the outer flow path and the inner flow path, and wherein the one of the outer flow path and the inner flow path includes an outer branch flow path extending from an outer peripheral side of the annular diffusion portion to the mounting surface, and an inner branch flow path extending from an inner peripheral side of the annular diffusion portion to the mounting surface.

9. The substrate stage of claim 1, wherein the partition wall is provided with a plurality of protrusions configured to support the substrate with the gap left between the upper end surface of the partition wall and the substrate.

10. A substrate processing apparatus, comprising:
a substrate stage of claim 1;
a processing chamber in which the substrate stage is provided;
a processing gas supplier configured to supply a processing gas for processing the substrate into the processing chamber; and
a heat transfer gas supplier configured to supply the heat transfer gas.

11. A temperature control method, comprising:
supporting a substrate along an outer peripheral side of the substrate by an annular support provided on a base portion having a mounting surface on which the substrate is mounted;
dividing the mounting surface into an outer region and an inner region in a radial direction of the substrate mounted on the mounting surface by an annular partition wall provided on the mounting surface, and supporting the substrate by a plurality of protrusions provided on the mounting surface in the outer region and the inner region with a gap left between an upper end surface of the partition wall and the substrate; and
diffusing a heat transfer gas supplied to a space between the substrate and the mounting surface via an outer flow path and an inner flow path, which are provided in the base portion and in communication with the outer region and the inner region, respectively, along a circumferential direction of the partition wall by an annular diffusion portion provided in the base portion.

12. The temperature control method of claim 11, further comprising:
diffusing the heat transfer gas along the circumferential direction of the partition wall by the annular diffusion portion, which is opened on the mounting surface and provided along an outer circumferential surface of the partition wall.

13. The temperature control method of claim 11, further comprising:
diffusing the heat transfer gas along the circumferential direction of the partition wall by the annular diffusion portion, which is provided inside the base portion and in communication with one of the outer flow path and the inner flow path; and
supplying the heat transfer gas to the space between the substrate and the mounting surface, by one of the outer flow path and the inner flow path, which includes an outer branch flow path extending from an outer peripheral side of the annular diffusion portion to the mounting surface and an inner branch flow path extending from an inner peripheral side of the annular diffusion portion to the mounting surface.

* * * * *